United States Patent [19]
Smith

[11] Patent Number: 5,899,711
[45] Date of Patent: May 4, 1999

[54] METHOD FOR ENHANCING HYDROGENATION OF THIN FILM TRANSISTORS USING A METAL CAPPING LAYER AND METHOD FOR BATCH HYDROGENATION

[75] Inventor: Donald L. Smith, Palo Alto, Calif.

[73] Assignee: Xerox Corporation, Stamford, Conn.

[21] Appl. No.: 08/731,356

[22] Filed: Oct. 11, 1996

[51] Int. Cl.$^6$ .................................. H01L 21/8244
[52] U.S. Cl. .................. 438/162; 438/162; 438/163; 438/164
[58] Field of Search .................. 438/902, 162, 438/163, 164, 528, 529, 798, 799, 166

[56] References Cited

U.S. PATENT DOCUMENTS

| | | | |
|---|---|---|---|
| 3,620,844 | 11/1971 | Wicke | 136/86 |
| 5,403,756 | 4/1995 | Yoshinouchi et al. | 437/24 |
| 5,470,763 | 11/1995 | Hamada . | |
| 5,504,020 | 4/1996 | Aomori et al. | 437/40 |
| 5,541,119 | 7/1996 | Kodama | 437/24 |
| 5,600,155 | 2/1997 | Wu | 257/72 |
| 5,627,085 | 5/1997 | Gosain et al. | 438/162 |
| 5,686,335 | 11/1997 | Wuu et al. | 437/48 |
| 5,728,610 | 3/1998 | Gosain et al. | 438/62 |

FOREIGN PATENT DOCUMENTS

| | | |
|---|---|---|
| 59-75665 | 4/1984 | Japan . |
| 60-245124 | 12/1985 | Japan . |
| 61-232675 | 10/1986 | Japan . |
| 62-221159 | 9/1987 | Japan . |

OTHER PUBLICATIONS

Stanely Wolf, Silicon Processing for the VLSI Era, vol. 1, pp. 169–174, 1986.

*Primary Examiner*—Charles Bowers
*Assistant Examiner*—Martin Sulsky
*Attorney, Agent, or Firm*—Oliff & Berridge, PLC

[57] ABSTRACT

A method for enhancing hydrogenation of an oxide-coated polycrystalline silicon thin-film transistor or devices includes depositing a metal capping layer on the device prior to hydrogenation. In addition, a method for batch hydrogenation of substrates or plates carrying the oxide-coated polycrystalline silicon devices includes placing the plates in a downstream flow from a hydrogen plasma.

16 Claims, 2 Drawing Sheets

METHOD FOR ENHANCING HYDROGENATION OF THIN FILM TRANSISTORS USING A METAL CAPPING LAYER AND METHOD FOR BATCH HYDROGENATION

BACKGROUND OF THE INVENTION

1. Field of Invention

The present invention is directed to the hydrogenation of polycrystalline silicon devices, such as thin-film transistors. More specifically, the present invention relates to a method for the enhancement of thin-film transistor hydrogenation using a metal capping layer. The present invention is also directed to a method for the batch hydrogenation of polycrystalline silicon thin-film transistors.

2. Description of Related Art

Polycrystalline silicon ("polysi") thin-film transistors ("TFT") are made on large glass plates for use in numerous applications, including, but not limited to, flat panel displays, scanners, printers, imagers, and the like.

The dangling bonds present in the polycrystalline silicon grain boundaries and at intra-grain defects need to be passivated by bonding them to hydrogen atoms in order to improve electrical performance of the thin-film transistors. This is usually done after the thin-film transistors have been patterned and passivated with an oxide coating. Otherwise, high-temperature processing (>350° C.) will drive the hydrogen out from the silicon.

Polycrystalline silicon thin-film transistors are presently passivated with hydrogen atoms by exposing the thin-film transistor plates to a hydrogen gas plasma. The hydrogen plasma contains variously active forms of hydrogen, mainly positive ions ($H^{3o}$) and hydrogen atoms (H). Under these conditions, a long exposure time of up to 16 hours is required to achieve full hydrogenation and saturation of the thin-film transistors.

Because the hydrogenation time is long and each thin-film transistor plate must be exposed to the hydrogen plasma one plate at a time, throughput is low and cost is high.

It is known in the art that the hydrogen passivation time of a thin-film transistor can be shortened by utilizing a non-doped insulating silicon oxide layer having a thickness less than 100 nm on top of a polycrystalline silicon transistor, as described in U.S. Pat. No. 5,470,763 to Hamada, the entire disclosure of which is herein incorporated by reference. However, the hydrogenation time for passivation reported in Hamada is 2.5 hours and contamination from an overlying boron-included phosphorus silicated glass (BPSG) layer is a concern.

Thus, there is a need to greatly improve hydrogenation efficiency, thereby decreasing the time for hydrogenation as well as the cost of the equipment, and allowing a stack of thin-film transistor plates to be batch hydrogenated for increased throughput.

SUMMARY OF INVENTION

The present invention overcomes these concerns and problems of the art by reducing hydrogenation time and by improving H uptake at the oxide surface. The present invention thereby increases equipment utilization by allowing batch processing without direct exposure of every plate to the plasma.

The present invention relates to a method for the enhanced hydrogenation of polysi devices such as thin-film transistors by using a metal capping layer. The present invention relates to a method that allows hydrogen to be injected into the oxide coating of a thin-film transistor rapidly through a metal capping layer.

The present invention also relates to a method and apparatus for the batch hydrogenation of a stack of thin-film transistor plates in a downstream flow of a plasma.

DETAILED DESCRIPTION OF PREFERRED EMBODIMENTS

The present invention relates to a process for the enhancement of hydrogenation of an oxide-coated polySi or poly Si-Ge alloy transistor or other device using a metal capping layer.

According to the present invention, a polySi transistor is covered with a conventional passivating silicon dioxide layer. The thickness of the oxide is from about 100 nm to about 1000 nm, and is preferably about 700 nm.

According to the present invention, the polySi transistor covered with a silicon oxide layer is capped with a metal layer. In embodiments, the metal layer includes, but is not limited to, aluminum (Al), palladium (Pd), platinum (Pt), nickel (Ni), and the like. In embodiments, Al and Pd are preferred. The metal capping layer is believed to act as a catalyst to increase the rate of hydrogen uptake into the oxide layer. The metal capping layer is deposited by evaporation or sputtering on the surface of an oxide-coated polySi substrate. Preferably, the metal is deposited by sputtering. The metal capping layer has a thickness from about 20 nm to about 200 nm.

In embodiments, the metal capping layer must cover the entire surface of the oxide-coated device. When Al is used as the capping layer and covers about 90% of the oxide-coated polySi device surface or less, there is no significant increase in H concentration over the hydrogen level in an uncapped polySi device. The approximately 10% of the oxide that is not capped apparently acts as a sink for the H dissolved in the oxide. Hydrogen reaching the oxide surface is rapidly evolved back into the plasma, probably as $H_2$. There appears to be a kinetic barrier to the hydrogen returning to the oxide from the plasma. Consequently, the entire oxide surface of the polySi device, such as a thin-film transistor, must be metal-capped.

Figure 1:
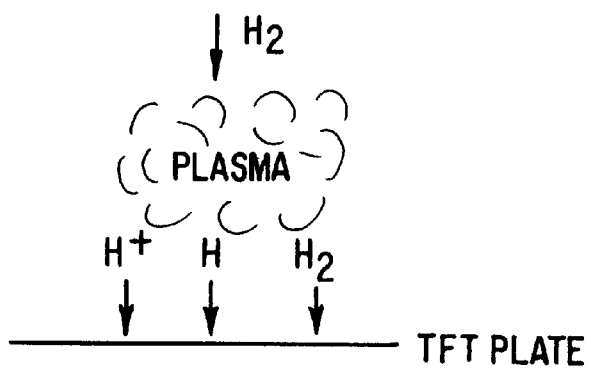
FIG. 1 shows a conventional plasma hydrogenation of a polycrystalline silicon thin-film transistor.

As shown in FIG. 1, conventional hydrogenation of polySi thin-film transistors on glass plates requires direct exposure of one plate at a time to a hydrogen plasma for about 8–16 hours. According to the present invention, a metal capping layer greatly reduces the time for hydrogenation, thereby significantly increasing throughput of the hydrogenation process.

In an embodiment of the present invention, Pd is used as a metal capping layer. Palladium is known in the art for its catalytic activity and high diffusion rate of hydrogen. See, for example, V. F. Kiselev & O. V. Kosglov, "Adsorption and Catalysis on Transition Metals and Their Oxides" (1989), the entire disclosure of which is incorporated herein by reference. Palladium can dissociatively adsorb $H_2$ gas and thereby assist absorption of the H into an underlying oxide. Consequently, it may be possible to hydrogenate Pd-capped oxide-coated poly Si substrates simply by exposure to the gas. Because only the gas is needed, the need for a hydrogen plasma may be eliminated. Palladium is believed to both assist in the absorption of H and to prevent the escape of hydrogen from the oxide surface. The Pd metal capping layer must then be etched off of the oxide-coated polysi substrate prior to source and drain metallization of a thin-film transistor.

If hydrogenation of an oxide-coated thin-film transistor can be enhanced using a metal capping layer corresponding to a source or drain metal, then the extra steps of deposition and etching would not be required. Source and drain metals that enhance hydrogenation include, but are not limited to Al, a titanium-tungsten (Ti—W) alloy, and the like. In embodiments, Al is preferred.

Figure 2:
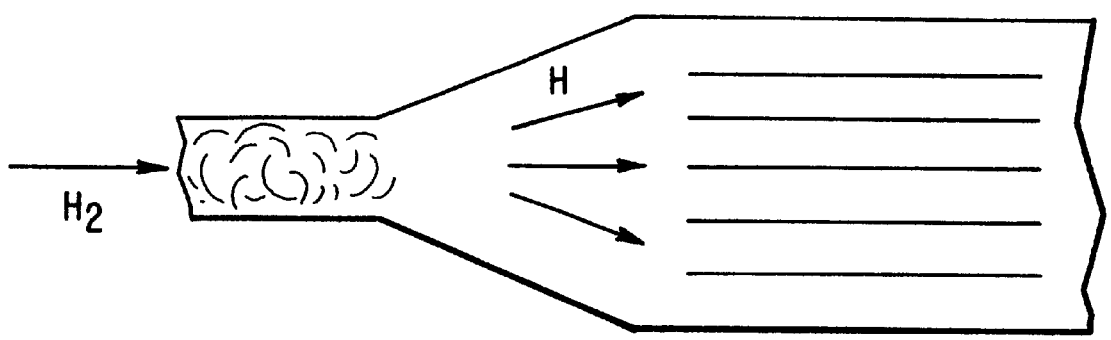
FIG. 2 shows a batch hydrogenation of thin-film transistors using hydrogen atoms (H) downstream of a hydrogen plasma.

According to another aspect of the present invention, direct plasma exposure is not necessary for hydrogenating polySi substrates, regardless of the presence or absence of a metal capping layer. Hydrogen atoms, and not H+ions, are sufficient to activate absorption. As shown in FIG. 2, hydrogenation of polySi thin-film transistors downstream of a plasma allows batch hydrogenation of thin-film transistors, rather than hydrogenating one thin-film transistor at a time as with direct plasma exposure. Throughput and efficiency are thereby further substantially increased, and process costs are lowered. FIG. 2 shows the batch hydrogenation of thin-film transistors downstream of a hydrogen plasma.

Figure 3:
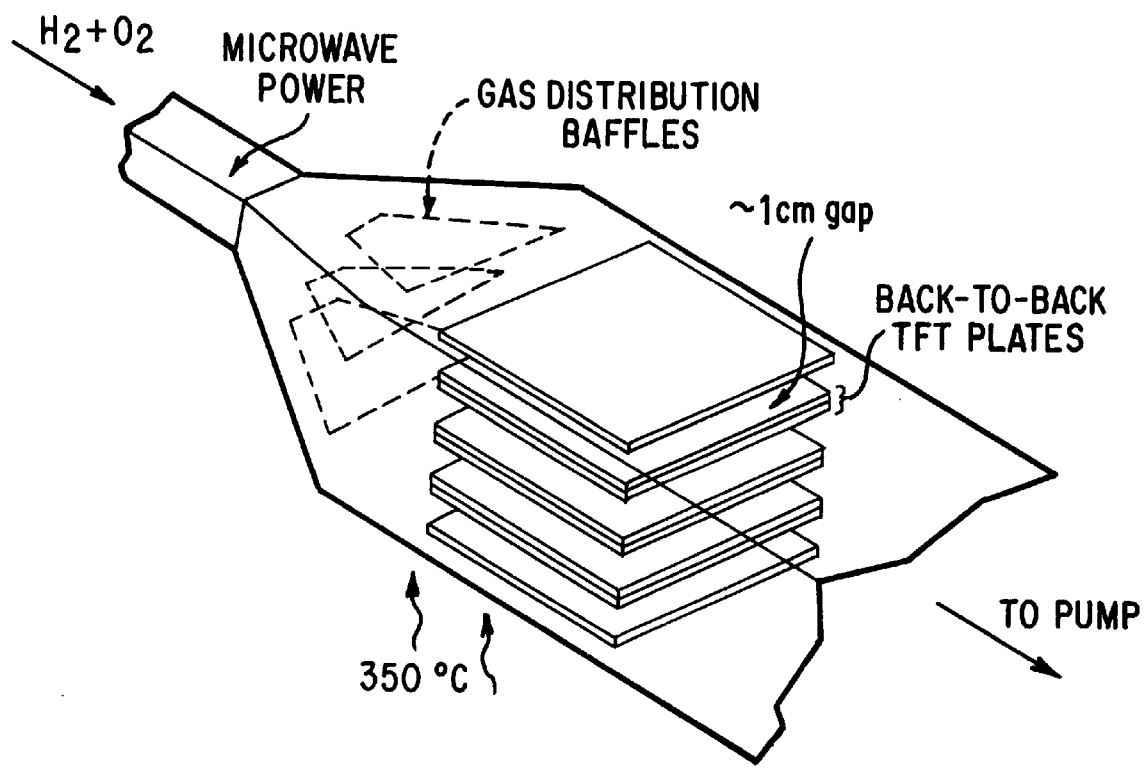
FIG. 3 shows a system for hydrogenating thin-film transistors downstream from a plasma source.

In an embodiment of the present invention, a stack of thin-film transistor plates are placed downstream of the plasma within a quartz tube or channel, as shown in FIG. 3. Any material with a low adsorption probability for hydrogen atoms can be utilized including, but not limited to quartz, aluminum oxide ceramics, Teflon® or similar fluorinated polymers and Teflon®-coated metal, and the like.

Positive hydrogen ions, $H_n^+$, wherein n is from 1 to 3, do not survive in the gas flow downstream of a plasma. The $H_n^+$ ions apparently get neutralized when they hit the tube or channel surface. Thus, H atoms are sufficient to serve as the supply of active H for the hydrogenation of the stacked thin-film transistor plates. The flow of hydrogen atoms to the thin-film transistor plates can be greatly increased without incurring ion damage that deteriorates thin-film transistor electrical performance.

It is known in the art that adding a small amount, such as a few percent, of oxygen or water vapor to a hydrogen plasma improves the survivability of H atoms downstream of the plasma. The oxygen or water vapor modifies the surface of a flow tube so as to reduce the recombination rate of H atoms on them to hydrogen gas, $H_2$.

The main advantage of the method of the present invention is that in production, a stack of thin-film transistor plates can be hydrogenated at once, as shown in FIG. 3. In an embodiment of the present invention, thin-film transistor plates are stacked back-to-back with a 1 cm gap in a quartz or quartz-like enclosure. Thus, about 50 plates can be accommodated in about a 30 cm high stack.

The quartz system illustrated in FIG. 3 uses a microwave beam as a convenient and low-cost power source to generate a hydrogen plasma. However, any suitable power source can be used in the present invention so long as the objects thereof are achieved. Other known sources include, but are not limited to, an RF inductive coil, a helicon antenna, or a 60 Hz transformer with a plasma loop acting as a secondary winding. Power sources that generate high plasma-sheath voltages, such as parallel-plate coupling, should be avoided because the resulting sputtering of the plasma cavity walls would shorten their life and possibly contaminate the process.

In a preferred embodiment of the present invention, the deposition chamber further comprises gas distribution baffles, as shown in FIG. 3. When incorporated in embodiments of the present invention, the gas baffles for distributing the H atoms uniformly across the stack of plates should have surfaces of low recombination rate for H atoms. Suitable materials for such surfaces include, but are not limited to, quartz or Teflon®-coated material.

EXAMPLES

Example 1

Two hundred nm of sputtered aluminum (Al) was applied to a $SiO_2$-coated polySi thin-film transistor before plasma hydrogenation at about 350° C. As measured by secondary ion mass spectrometry ("SIMS"), the hydrogen concentration at the underlying polySi interface showed about a 14-fold increase over a thin-film transistor that was not capped with a sputtered Al capping layer. Thus, the time required to hydrogenate polySi thin-film transistors was reduced from about 16 hours to about 1.2 hours.

Example 2

Arrays of thin-film transistors on quartz substrates about 2 $cm^2$ in dimension was placed about 30 cm downstream of the quartz-tube inlet and are hydrogenated for about 1 hour at about 350° C. and at about 0.3 Torr in a flow of about 200 standard cubic centimeter per minute ("SCCM") $H_2$ +4 SCCM $O_2$ emanating from a 400 W microwave plasma cavity.

The electrical data shown in Table 1 indicate thin-film transistor activation and electrical properties similar to that achieved in an 8 hour conventional hydrogenation in which the thin-film transistors are directly exposed to a parallel-plate RF plasma at the same temperature. In addition, the electrical properties (i.e., mobility, leakage, threshold and turn-on slope) of the thin-film transistors hydrogenated downstream of the hydrogen plasma are significantly better than the properties of an unhydrogenated thin-film transistor.

TABLE 1

| TFT PROPERTY: | MOBILITY | LEAKAGE | THRESHOLD | TURN-ON SLOPE (INVERSE) |
| --- | --- | --- | --- | --- |
| unhydrogenated | 62 $cm^2$/V-s | 139 pA | 5.0 V | 0.88 V/decade |
| 8 hours RF | 95 | 15 | 1.7 | 0.31 |
| 1 hour downstream | 92 | 20 | 2.6 | 0.39 |

What is claimed is:

1. A method of hydrogenating a polycrystalline silicon device, comprising:

depositing a silicon dioxide passivating layer on a polycrystalline silicon device;

forming a continuous metal capping layer covering an entire surface of said silicon dioxide passivating layer; and hydrogenating said device having said continuous metal capping layer in the presence of a hydrogen plasma.

2. The hydrogenating method according to claim 1, wherein said device is a transistor that comprises polycrystalline silicon.

3. The hydrogenating method according to claim 1, wherein said hydrogenating occurs at a temperature of about 350° C.

4. The hydrogenating method according to claim 1, wherein said metal is selected from the group consisting of aluminum, platinum, palladium and nickel.

5. The hydrogenating method according to claim 1, wherein said forming comprises sputtering to form said continuous metal capping layer.

6. The hydrogenating method according to claim 1, wherein said silicon dioxide passivating layer has a thickness of from about 100 nm to about 1000 nm.

7. The hydrogenating method according to claim 1, wherein said metal capping layer has a thickness of from about 20 nm to about 200 nm.

8. The hydrogenating method according to claim 1, wherein said hydrogenating is performed for about 1.2 hours.

9. A method of hydrogenating a polycrystalline silicon device, comprising:

depositing a silicon dioxide layer on said polycrystalline silicon device;

forming a palladium capping layer on said silicon dioxide layer; and hydrogenating said device in the presence of a hydrogen gas.

10. A method of batch hydrogenating polycrystalline silicon thin-film devices, comprising:

placing a plurality of substrates or plates carrying polycrystalline silicon thin-film devices in a vessel downstream of a hydrogen plasma; and hydrogenating said devices with a supply of hydrogen atoms.

11. The batch hydrogenating method of claim 10, wherein said devices comprise a continuous metal capping layer covering an entire surface of a silicon dioxide layer.

12. The batch hydrogenating method of claim 11, further comprising adding oxygen or water vapor to said hydrogen plasma.

13. The batch hydrogenating method of claim 11, wherein said hydrogenating occurs at a temperature of about 350° C. and pressure of about 0.3 Torr.

14. The batch hydrogenating method of claim 11, wherein said hydrogenating is for about 1 hour.

15. The hydrogenating method according to claim 9, wherein the palladium capping layer is continuous and covers an entire surface of the silicon dioxide layer.

16. The batch hydrogenating method of claim 11, wherein said metal is palladium.

* * * * *